United States Patent
Cho et al.

(10) Patent No.: US 9,165,924 B2
(45) Date of Patent: Oct. 20, 2015

(54) VERTICAL CHANNEL TYPE NONVOLATILE MEMORY DEVICE AND METHOD FOR FABRICATING THE SAME

(71) Applicant: SK hynix Inc., Gyeonggi-do (KR)

(72) Inventors: Heung-Jae Cho, Gyeonggi-do (KR); Yong-Soo Kim, Gyeonggi-do (KR); Beom-Yong Kim, Gyeonggi-do (KR); Won-Joon Choi, Gyeonggi-do (KR); Jung-Ryul Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/788,319

(22) Filed: Mar. 7, 2013

(65) Prior Publication Data

US 2013/0175603 A1    Jul. 11, 2013

Related U.S. Application Data

(62) Division of application No. 12/493,515, filed on Jun. 29, 2009, now abandoned.

(30) Foreign Application Priority Data

Dec. 24, 2008  (KR) .................. 10-2008-0133015
Apr. 13, 2009  (KR) .................. 10-2009-0031902

(51) Int. Cl.
*H01L 29/792* (2006.01)
*H01L 27/088* (2006.01)
*H01L 27/115* (2006.01)

(52) U.S. Cl.
CPC ........ *H01L 27/088* (2013.01); *H01L 27/11578* (2013.01); *H01L 27/11582* (2013.01); *H01L 29/792* (2013.01); *H01L 29/7926* (2013.01)

(58) Field of Classification Search
CPC .............. H01L 29/792; H01L 29/7926; H01L 29/7788; H01L 27/11578; H01L 27/11582; H01L 27/088; H01L 27/11524; H01L 29/42324; H01L 27/11556; H01L 29/66833; H01L 27/11519
USPC .......... 257/324, 328, 329, E21.676, E21.693, 257/326, E29.3; 438/212, 268, 287
See application file for complete search history.

(56) References Cited

U.S. PATENT DOCUMENTS 6,406,962 B1    6/2002  Agnello et al.
7,442,987 B2 *  10/2008 Kim et al. ................. 257/316
(Continued)

FOREIGN PATENT DOCUMENTS

CN    101241914    8/2008
CN    101483194    7/2009

OTHER PUBLICATIONS

Patent issued by the State Intellectrual Property Office of P.R.C on Aug. 7, 2013.
(Continued)

*Primary Examiner* — Khiem D Nguyen
(74) *Attorney, Agent, or Firm* — IP & T Group LLP

(57) ABSTRACT

A method for fabricating a vertical channel type nonvolatile memory device includes: alternately forming a plurality of sacrificial layers and a plurality of interlayer dielectric layers over a semiconductor substrate; etching the sacrificial layers and the interlayer dielectric layers to form a plurality of first openings for channel each of which exposes the substrate; filling the first openings to form a plurality of channels protruding from the semiconductor substrate; etching the sacrificial layers and the interlayer dielectric layers to form second openings for removal of the sacrificial layers between the channels; exposing side walls of the channels by removing the sacrificial layers exposed by the second openings; and forming a tunnel insulation layer, a charge trap layer, a charge blocking layer, and a conductive layer for gate electrode on the exposed sidewalls of the channels.

4 Claims, 28 Drawing Sheets

(56) References Cited

U.S. PATENT DOCUMENTS

| | | |
|---|---|---|
| 2002/0140032 A1 | 10/2002 | Cho et al. |
| 2005/0133860 A1 | 6/2005 | Forbes |
| 2006/0186446 A1* | 8/2006 | Kim et al. .................. 257/296 |
| 2007/0158736 A1* | 7/2007 | Arai et al. .................. 257/315 |
| 2008/0179659 A1* | 7/2008 | Enda et al. .................. 257/326 |
| 2009/0121271 A1* | 5/2009 | Son et al. .................. 257/315 |
| 2009/0184360 A1* | 7/2009 | Jin et al. .................. 257/319 |
| 2010/0006922 A1* | 1/2010 | Matsuoka et al. .......... 257/324 |

OTHER PUBLICATIONS

Notice of Preliminary Rejection issued by the State Intellectual Property Office of People's Republic of China on Dec. 20, 2013.

* cited by examiner

VERTICAL CHANNEL TYPE NONVOLATILE MEMORY DEVICE AND METHOD FOR FABRICATING THE SAME

CROSS-REFERENCES TO RELATED APPLICATIONS

This application is a division of U.S. patent application Ser. No. 12/493,515 filed on Jun. 29, 2009, which claims priority of Korean Patent Application Nos. 10-2008-0133015 filed on Dec. 24, 2008 and of Korean Patent Application No. 10-2009-0031902 filed on Apr. 13, 2009. The disclosure of each of the foregoing applications is incorporated herein by reference in their entirety.

BACKGROUND OF THE INVENTION

The present invention relates to a nonvolatile memory device and a method for fabricating the same, and more particularly, to a vertical channel type nonvolatile memory device and a method for fabricating the same.

Memory devices are classified into volatile memory devices and nonvolatile memory devices according to whether data is retained when power is interrupted. Volatile memory devices lose data when power is interrupted. Examples of volatile memory devices include dynamic random access memory (DRAM) and static random access memory (SRAM). In contrast, nonvolatile memory devices retain stored data even when power is interrupted. Examples of nonvolatile memory devices include flash memory.

Nonvolatile memory devices are classified into floating gate type nonvolatile memory devices and charge trap type nonvolatile memory devices according to data storing methods.

A floating gate type nonvolatile memory device includes a plurality of memory cells, each of which has a tunnel insulation layer, a floating gate electrode, a charge blocking layer, and a control gate electrode being formed over a substrate. The floating gate type nonvolatile memory device stores data by accumulating charges within a conduction band of the floating gate electrode.

A charge trap type nonvolatile memory device includes a plurality of memory cells, each of which has a tunnel insulation layer, a charge trap layer, a charge blocking layer, and a control gate electrode being formed over a substrate. The charge trap type nonvolatile memory device stores data by trapping charges in a deep-level trap site within the charge trap layer.

However, planar nonvolatile memory devices fabricated in a single layer over a silicon substrate have limitations in improving integration density due to fine pattern formation as patterning technologies have reached limitations in some aspects.

Therefore, there have been proposed vertical channel type nonvolatile memory devices in which strings are vertically arranged over a substrate. A vertical channel type nonvolatile memory device includes a lower selection transistor, a plurality of memory cells, and an upper selection transistor, which are sequentially formed over a substrate. The vertical channel type nonvolatile memory device can improve integration density because the strings are arranged vertically over the substrate.

Hereinafter, a conventional method for fabricating a vertical channel type nonvolatile memory device will be described with reference to the accompanying drawings.

FIGS. 1A to 4B are exemplary diagrams illustrating a conventional method for fabricating a vertical channel type nonvolatile memory device. For the sake of convenience, a description about a process of forming a lower selection transistor and an upper selection transistor is omitted, and the following description will be focused on a process of forming a plurality of memory cells. In particular, figures "A" are cross-sectional views illustrating intermediate results, and figures "B" are plan views at height A-A' of figures "A".

Referring to FIGS. 1A and 1B, a plurality of interlayer dielectric layers 11 and a plurality of conductive layers 12 for gate electrode are alternately formed over a substrate 10 where a lower structure including a source line, a lower selection transistor, and the like is formed. The interlayer dielectric layers 11 and the conductive layers 12 are selectively etched to form a plurality of contact holes H exposing the substrate 10.

Referring to FIGS. 2A and 2B, a charge blocking layer 13 is formed on inner walls of the contact holes H. The charge blocking layer 13 prevents charges from passing through the charge trap layer 14 and moving toward the gate electrode.

A charge trap layer 14 is formed over the charge blocking layer 13. The charge trap layer 14 traps charges in a deep-level trap site and serves as a substantial data storage. The charge trap layer 14 is formed of nitride.

A tunnel insulation layer 15 is formed within the contact holes H in which the charge blocking layer 13 and the charge trap layer 14 are formed. The tunnel insulation layer 15 serves as an energy barrier layer because of tunneling of charges.

Referring to FIGS. 3A and 3B, a center region of the tunnel insulation layer 15 is etched to form openings for channel which expose the substrate 10. The openings for channel are filled with a layer for channel to form a plurality of channels 16 protruding from the substrate 10.

Referring to FIGS. 4A and 4B, a plurality of mask patterns (not shown) are formed over a resulting structure where the channels 16 are formed. The plurality of mask patterns cover a region for memory cells MC and extend in a first direction I-I'. Using the mask patterns as an etch barrier, the interlayer dielectric layer 11 and the conductive layer 12 for gate electrode are etched to form a plurality of gate electrodes 12A. The etched region is filled with an insulation layer 17.

In this way, a plurality of memory cells MC each including the tunnel insulation layer 15, the charge trap layer 14, the charge blocking layer 13, and the gate electrode surrounding the outer surface of the vertical channel 16 are formed. At this point, the memory cells MC stacked along the same channel 16 constitute one string. In addition, the memory cells MC connected to the gate electrode 12A (memory cells arranged in the first direction I-I') operate as one page. That is, a plurality of memory cells MC formed in each layer operate as a plurality of pages.

FIG. 5 is a perspective view explaining a process of forming word lines in the conventional vertical channel type nonvolatile memory device.

Referring to FIG. 5, the interlayer dielectric layers 11 and the gate electrodes 12A are patterned to expose the gate electrodes 12A of the memory cells stacked along the channels 16. Word lines 18 connected to the gate electrodes of the memory cells are formed.

As described above, since the plurality of memory cells formed on the same layer operate as the plurality of pages, the word lines 18 must be formed in each page even though the gate electrodes 12A are formed on the same layer.

According to the prior art, the channels 16 are formed after forming the conductive layers 12 for gate electrode, the charge blocking layer 13, the charge trap layer 14, and the tunnel insulation layer 15. That is, since the fabrication process of the vertical channel type nonvolatile memory device is performed in reverse order of that of the planar nonvolatile memory device, the characteristics of the memory device are degraded, which will be described hereinafter in more detail.

First, degradation in the layer quality of the tunnel insulation layer 15 causes degradation in date retention characteristic and reliability. Since the nonvolatile memory device stores and erases data by using Fowler-Nordheim (F-N) tunneling, the layer quality of the tunnel insulation layer 15 serving as the energy barrier in the F-N tunneling has a great influence on the characteristics of the memory device.

However, the layer quality of the tunnel insulation layer 15 is degraded because the tunnel insulation layer 15 is formed at the last time and the openings for channel are formed by etching the center region of the tunnel insulation layer 15.

Second, since the channels 16 formed of polysilicon are formed in order to prevent damage of the charge blocking layer 13, the charge trap layer 14, and the tunnel insulation layer 15 in a process of forming the layer for channel within the openings, the current flow in the channels 16 is lowered and the uniformity of a threshold voltage distribution is degraded.

A single crystal silicon growth process is typically performed using a silicon source gas and an HCl gas at high temperature. The silicon source gas supplies silicon source for growing single crystal silicon, and removes a natural oxide layer formed on the substrate 10 through an oxidation-reduction reaction, or removes silicon deposited on the insulation layer, thereby growing single crystal silicon only on the surface of the substrate 10.

If the single crystal silicon growth process is applied to the process of forming the channels 16 of the conventional vertical channel type nonvolatile memory device, the charge blocking layer 13, the charge trap layer 14, and the tunnel insulation layer 15 are damaged. Therefore, there is a difficulty in forming the channels 16 of single crystal silicon.

Meanwhile, since the tunnel insulation layer 15, the charge trap layer 14, the charge blocking layer 13, and the gate electrode are formed to surround the outer surface of the channel 16, one string ST is formed with respect to one channel 16. Therefore, there is a limitation in increasing the integration density of the nonvolatile memory device.

Furthermore, it is necessary to form the word lines 18 at each page with respect to the gate electrodes 12A formed on each layer. Thus, an area for formation of the word lines 18 at each page is required and thus there is another limitation in increasing the integration density of the memory device.

SUMMARY OF THE INVENTION

An embodiment of the present invention is directed to providing a vertical channel type nonvolatile memory device, which has a channel, a tunnel insulation layer, a charge trap layer, and a charge blocking layer being sequentially formed, and a method for fabricating the same.

Another embodiment of the present invention is directed to providing a vertical channel type nonvolatile memory device, which has at least two strings sharing one channel, and a method for fabricating the same.

Another embodiment of the present invention is directed to providing a vertical channel type nonvolatile memory device, in which a plurality of memory cells formed on the same layer operate as one page, and a method for fabricating the same.

In accordance with an aspect of the present invention, there is provided a method for fabricating a vertical channel type nonvolatile memory device, the method including: alternately forming a plurality of sacrificial layers and a plurality of interlayer dielectric layers over a substrate; etching the sacrificial layers and the interlayer dielectric layers to form a plurality of first openings for channel, each of which exposes the substrate; filling the first openings with a layer for a channel to form a plurality of channels protruding from the substrate; etching the sacrificial layers and the interlayer dielectric layers to form second openings for removal of the sacrificial layers between the channels; exposing sidewalls of the channels by removing the sacrificial layers exposed by the second openings for removal of the sacrificial layers; and sequentially forming a tunnel insulation layer, a charge trap layer, a charge blocking layer, and a conductive layer for gate electrode on the exposed sidewalls of the channels.

In accordance with another aspect of the present invention, there is provided a method for fabricating a vertical channel type nonvolatile memory device, the method including: alternately forming a plurality of sacrificial layers and a plurality of interlayer dielectric layers over a substrate; etching the sacrificial layers and the interlayer dielectric layers to form a plurality of first openings for channel each of which exposes the substrate; filling the first openings with a layer for a channel to form a plurality of rectangular pillar type channels protruding from the substrate; etching the sacrificial layers and the interlayer dielectric layers to form second openings for removal of the sacrificial layers which are disposed between the channels; exposing sidewalls of the channels by removing the sacrificial layers exposed by the second openings for removal of the sacrificial layers; and sequentially forming a tunnel insulation layer, a charge trap layer, a charge blocking layer, and a conductive layer for gate electrode on the exposed sidewalls of the channels.

In accordance with another aspect of the present invention, there is provided a vertical channel type nonvolatile memory device, which includes: a plurality of channels protruding from a substrate; and a plurality of strings including a plurality of memory cells stacked along the channels, wherein at least two of the strings share one channel.

In accordance with another aspect of the present invention, there is provided a vertical channel type nonvolatile memory device, which includes: a channel protruding vertically from a substrate; a string comprising a plurality of memory cells stacked along the channel; and a spacer on sidewalls of gate electrodes of the memory cells.

In accordance with another aspect of the present invention, there is provided a vertical channel type nonvolatile memory device, which includes: a channel protruding vertically from a substrate; and a string comprising a plurality of memory cells stacked along the channel, wherein the memory cells disposed on the same layer operate as one page.

DESCRIPTION OF SPECIFIC EMBODIMENTS

Figure 1A:
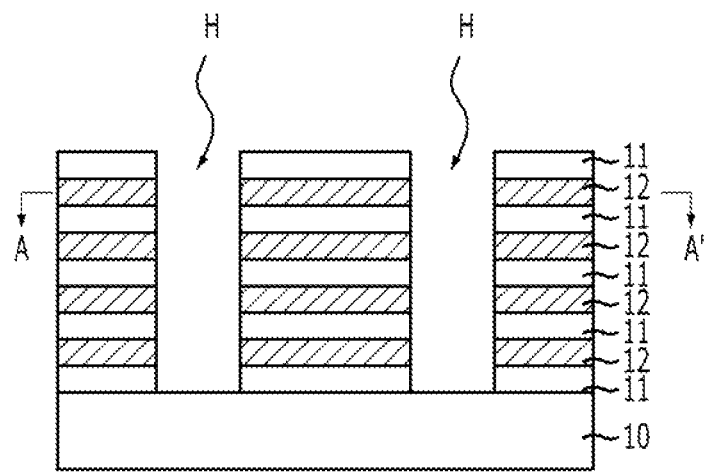
FIGS. 1A to 4B are diagrams illustrating a conventional method for fabricating a vertical channel type nonvolatile memory device.
Figure 1B:
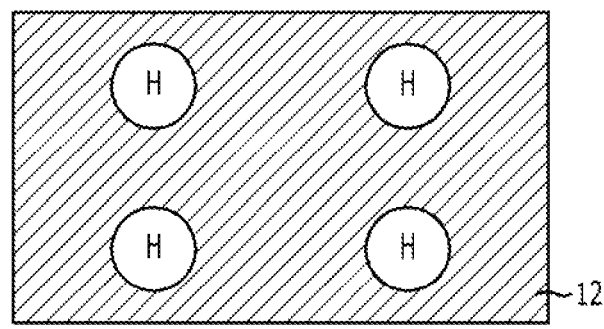
Figure 2A:
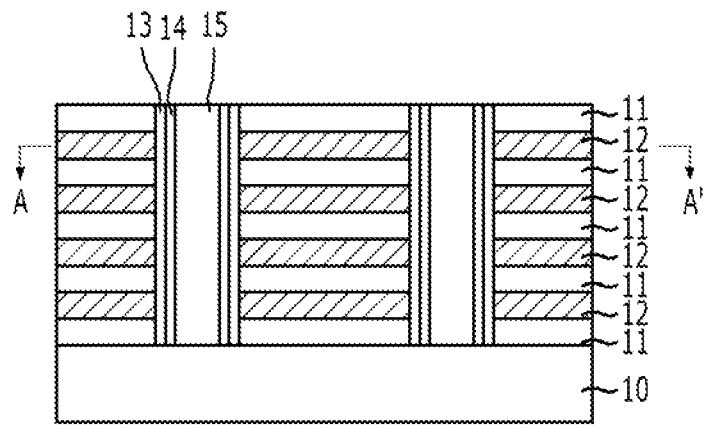
Figure 2B:
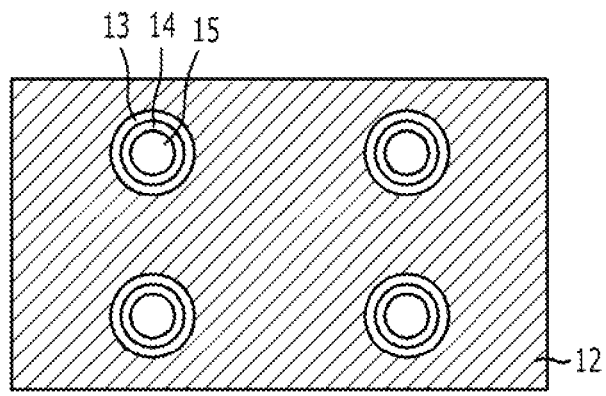
Figure 3A:
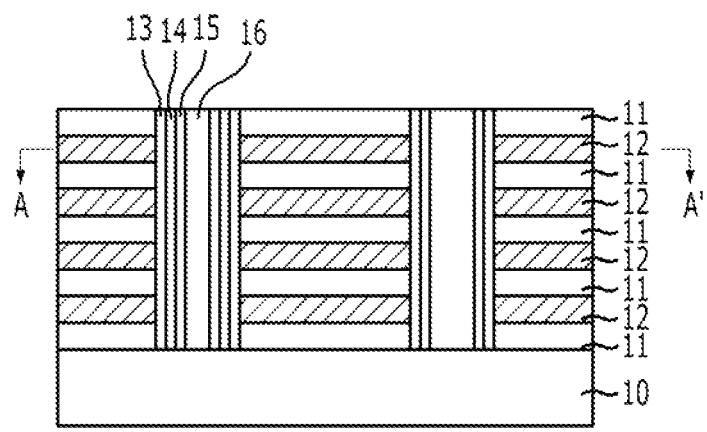
Figure 3B:
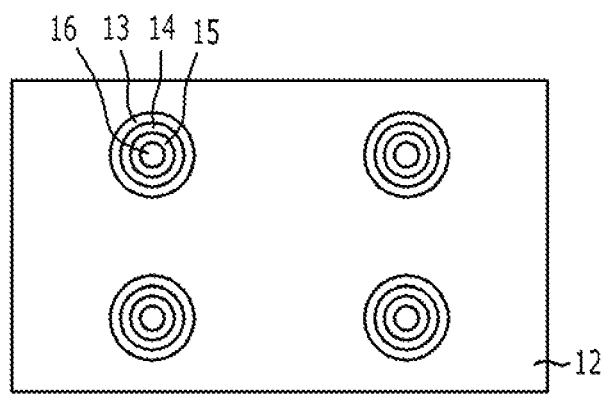
Figure 4A:
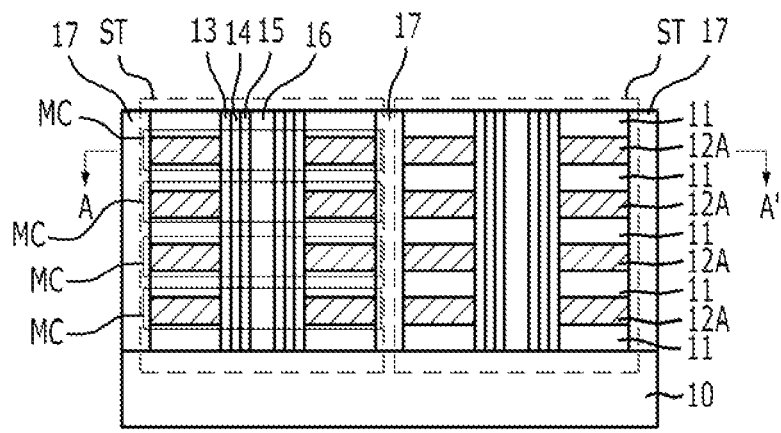
Figure 4B:
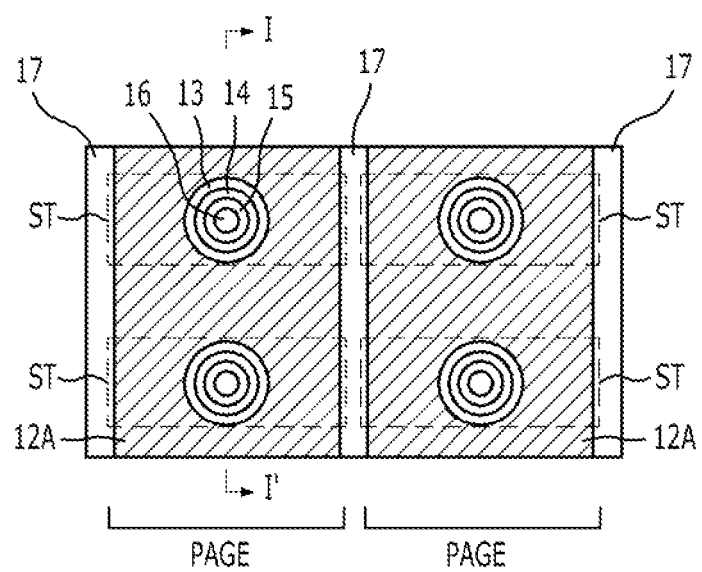
Figure 5:
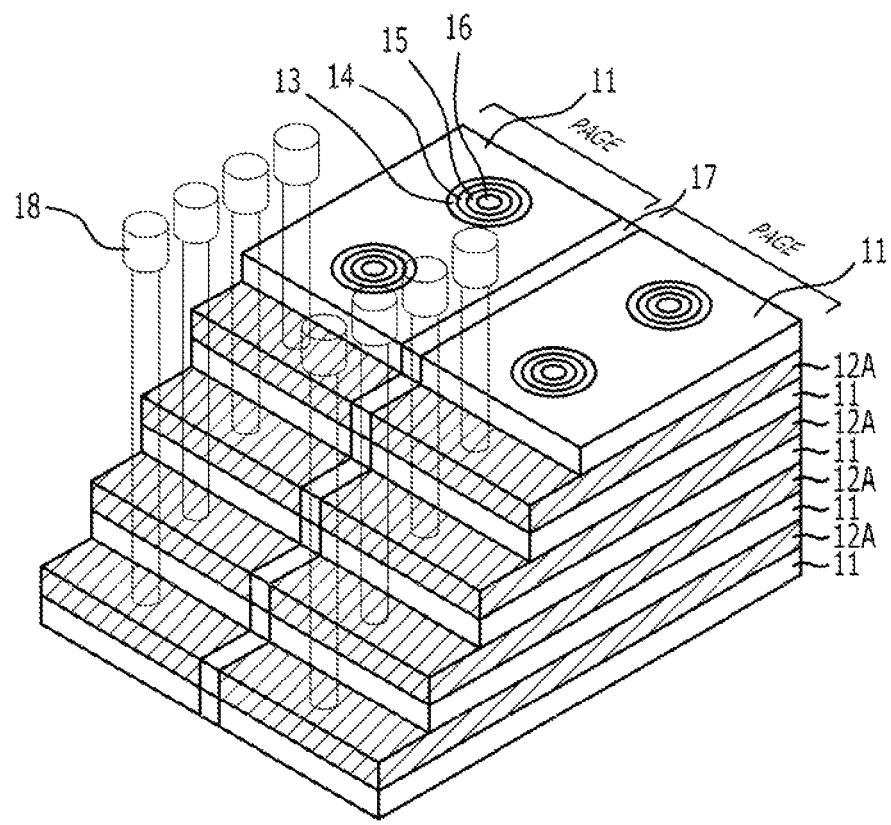
FIG. 5 is a perspective view explaining a process of forming word lines in the conventional vertical channel type nonvolatile memory device.

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

For the sake of convenience, a description about a process of forming a lower selection transistor and an upper selection transistor is omitted, and the following description will be focused on a process of forming a plurality of memory cells.

A first embodiment of the present invention provides a nonvolatile memory device which has a channel, a tunnel insulation layer, a charge trap layer, a charge blocking layer, and a gate electrode being sequentially formed, and a method for fabricating the same. A second embodiment of the present invention provides a nonvolatile memory device which has at least two strings sharing one channel, and a method for fabricating the same. A third embodiment of the present invention provides a nonvolatile memory device in which a plurality of memory cells formed on the same layer operate as one page, and a method for fabricating the same.

FIGS. 6A to 11B are diagrams illustrating a method for fabricating a vertical channel type nonvolatile memory device in accordance with a first embodiment of the present invention. In particular, a case of using line type openings for removal of sacrificial layers is illustrated. Figures "A" are cross-sectional views illustrating intermediate results, and figures "B" are plan views at height A-A' of figures "A".

Figure 6A:
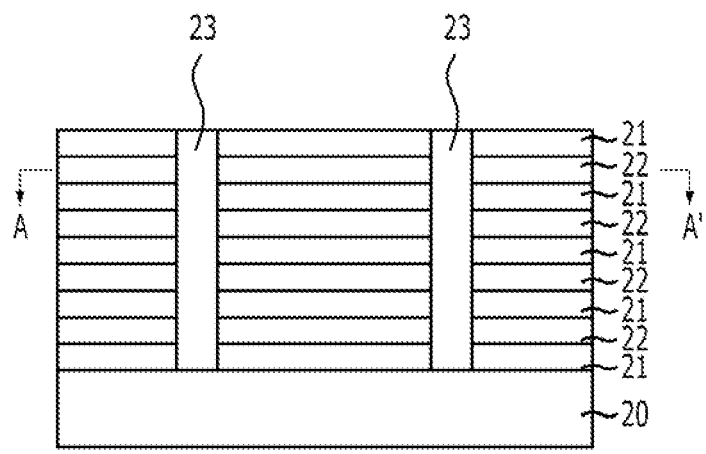
FIGS. 6A to 11B are diagrams illustrating a method for fabricating a vertical channel type nonvolatile memory device in accordance with a first embodiment of the present invention.
Figure 6B:
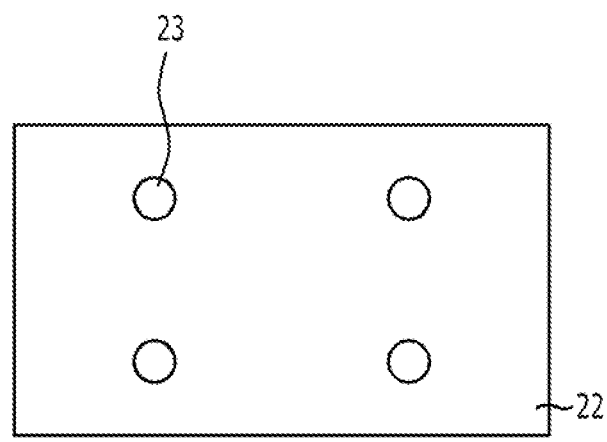

Referring to FIGS. 6A and 6B, a plurality of interlayer dielectric layers 21 and a plurality of sacrificial layers 22 are alternately formed on a substrate 20 where a lower structure including a source line, a lower selection transistor, and the like is formed.

The source line may include a silicon substrate, a conductive material layer, a material layer formed by doping impurities into an insulator, or a metal layer. The interlayer insulation layer 21 separates a plurality of memory cells from one another, where the plurality of memory cells constitutes a string, and may be formed of oxide, for example, $SiO_2$.

The sacrificial layer 22 ensures a space necessary for forming a tunnel insulation layer, a charge trap layer, a charge blocking layer, and a gate electrode in a subsequent process. The sacrificial layer 22 may be formed repetitively as many as the memory cells constituting a string.

The space necessary for forming the tunnel insulation layer, the charge trap layer, the charge blocking layer, and the gate electrode is ensured by selectively removing only the sacrificial layer 22 in a subsequent process while a plurality of interlayer dielectric layers 21 are remaining. Therefore, the sacrificial layer 22 may be formed of a material having a high etch selectivity ratio to the interlayer dielectric layers 21. For example, when the interlayer dielectric layers 21 are formed of oxide, the sacrificial layer 22 may be formed of amorphous carbon or nitride, for example, $Si_3N_4$.

The interlayer dielectric layers 21 and the sacrificial layers 22 are selectively etched to form a plurality of openings for channel, each of which expose the substrate 20.

The openings for channel may be arranged in a first direction and a second direction intersecting with the first direction. The interval between the openings may be determined, considering the thickness of a tunnel insulation layer, a charge trap layer, a charge blocking layer, and a gate electrode which will be formed in a subsequent process.

A plurality of hole type openings for channel are exemplarily illustrated in the drawings, and it is apparent that the openings for channel can be modified in various forms, for example, a rectangular pillar type, according to intention of those skilled in the art.

The openings for channel are filled with a layer for channel to form a plurality of channels 23 protruding from the substrate 20.

The channels 23 may be formed of polycrystal silicon or single crystal silicon. For example, when the channels 23 are formed of single crystal silicon, the channels 23 may be formed using a silicon source gas and an HCl gas at high temperature. In accordance with the first embodiment of the present invention, the channels 23 are formed prior to formation of the tunnel insulation layer, the charge trap layer, and the charge blocking layer. Thus, the tunnel insulation layer, the charge trap layer, and the charge blocking layer will not be damaged in the process of forming the channels 23. Consequently, the channels 23 can be formed of single crystal silicon without any defect.

Figure 7A:
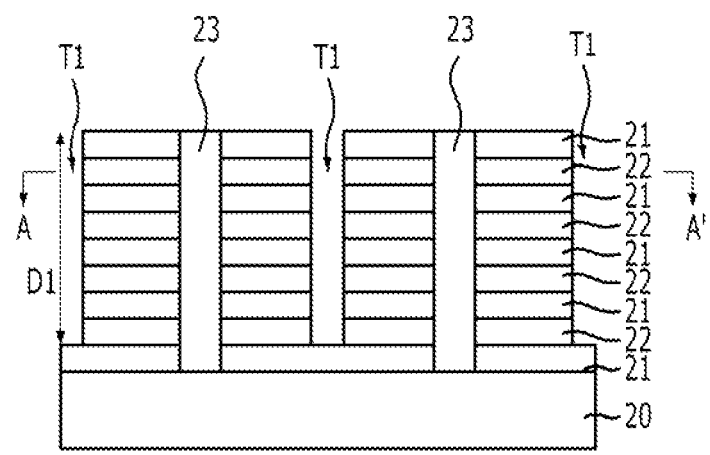
Figure 7B:
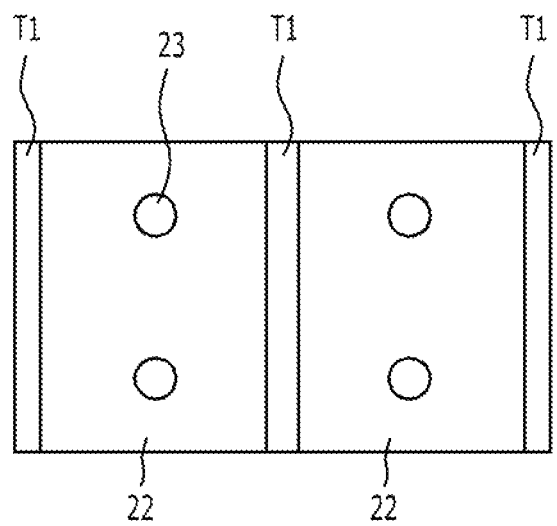

Referring to FIGS. 7A and 7B, the multi-layered sacrificial layers 22 and the multi-layered interlayer dielectric layers 21 are selectively etched so that openings T1 for removal of the sacrificial layers are formed between a plurality of the channels 23.

The openings T1 are formed for removing the sacrificial layers 22. The openings T1 may be formed to a depth D1 at which at least the lowermost sacrificial layer 22 is exposed. In this case, all the sacrificial layers 22 may be exposed through inner walls of the openings T1, and therefore, all the sacrificial layers 22 can be removed.

While a case where line type openings T1 for removal of the sacrificial layers, which extend in parallel in a certain direction, is illustrated as one exemplary embodiment, it is apparent to those skilled in the art that various types of the openings T1 for removal of the sacrificial layers may also be formed.

Figure 8A:
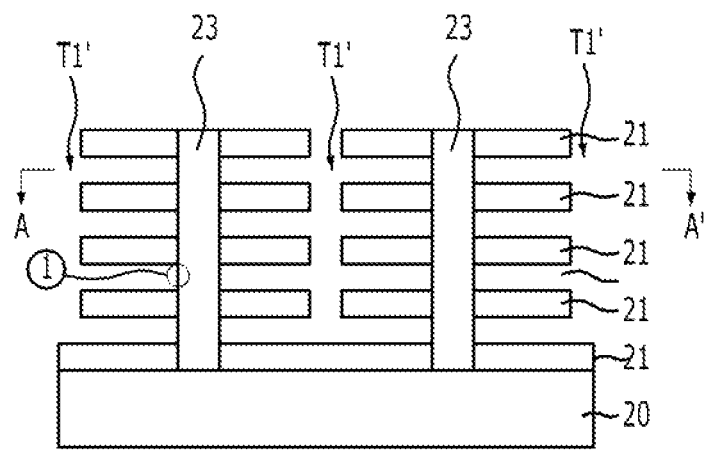
Figure 8B:
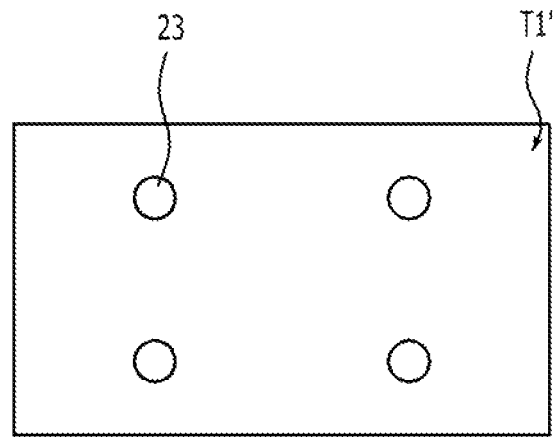

Referring to FIGS. 8A and 8B, the sacrificial layers 22 exposed by the openings T1 are removed to expose sidewalls of the channels 23. At this point, due to the removal of the sacrificial layers 22, the openings T1' for removal of the sacrificial layers extend up to the sidewalls of the channels 23.

The removal of the sacrificial layers 22 is performed to selectively remove only the sacrificial layers 22 while the interlayer dielectric layers 21 are remaining substantially in their original shapes. Therefore, the sidewalls of the channels 23 are exposed at a certain interval with the space where the sacrificial layers 22 are removed (see, ① of FIG. 8A), and the tunnel insulation layer, the charge trap layer, the charge blocking layer, and the gate electrode are formed in the space, where the sacrificial layers 22 are removed, in a subsequent process.

As mentioned above, when the interlayer insulation layers 21 are formed of $SiO_2$ and the sacrificial layers are formed of $Si_3N_4$, the removal of the sacrificial layers 22 may be performed using a phosphoric acid, for example, $H_3PO_4$, at a temperature ranging from approximately 50° C. to approximately 200° C. In this case, only the sacrificial layers 22 can be selectively removed through the chemical formula 1 described as follows.

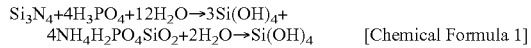

[Chemical Formula 1]

Figure 9A:
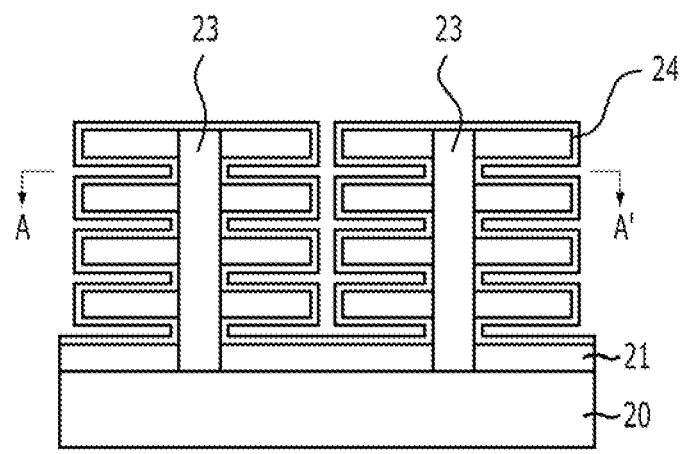
Figure 9B:
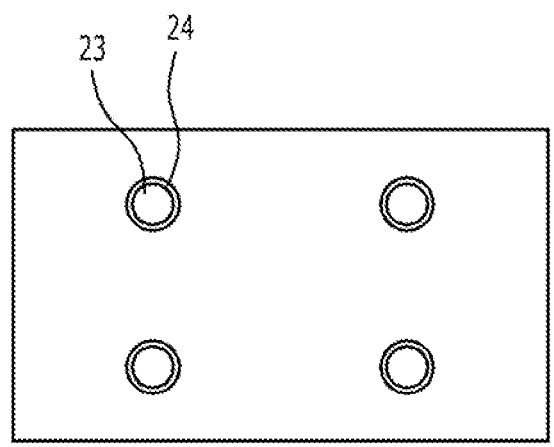

Referring to FIGS. 9A and 9B, the tunnel insulation layer, the charge trap layer, and the charge blocking layer 24 are sequentially formed over a resulting structure where the channels 23 are exposed. Therefore, the tunnel insulation layer, the charge trap layer, and the charge blocking layer 24 are sequentially formed on sidewalls of the exposed channels 23. The tunnel insulation layer, the charge trap layer, and the charge blocking layer are illustrated as one layer and represented by a reference numeral "24".

In sequentially forming the tunnel insulation layer, the charge trap layer, and the charge blocking layer 24 over the resulting structure where the sacrificial layers 22 are removed, the tunnel insulation layer, the charge trap layer, and the charge blocking layer 24 may be formed to a certain thickness at which the space between the interlayer dielectric layers 21 is not completely filled. That is, the tunnel insulation layer, the charge trap layer, and the charge blocking layer 24 may be formed to a certain thickness at which the space between the interlayer dielectric layers 21 is opened to some degree so that the space for gate electrode may be ensured. In this way, spacers may be formed between the interlayer dielectric layer 21 and conductive layers 25 for gate electrode which will be formed in a subsequent process.

The formation of the tunnel insulation layer may be performed by an oxidation process or a chemical vapor deposition (CVD) process. The charge trap layer may include a charge trapping layer for trapping charges or a charge storage layer for storing charges. The charge trapping layer may be formed of nitride, and the charge storage layer may be formed of polycrystal silicon. In particular, the charge trapping layer may include a high-dielectric-constant material, for example, $Si_xN_y$, Hf, Zr, La, Dy or Sc. The charge blocking layer may include a two-component material, for example, $SiO_2$, $Al_2O_3$, $HfO_2$, $ZrO_2$, GdO, DyO, or. ScO, or a three-component material, for example, HfAlO, HfLaO, AlLaO, GdAlO, or GdLaO.

Figure 10A:
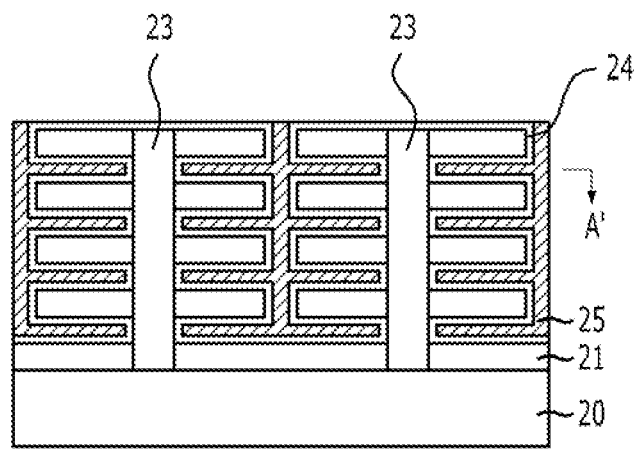
Figure 10B:
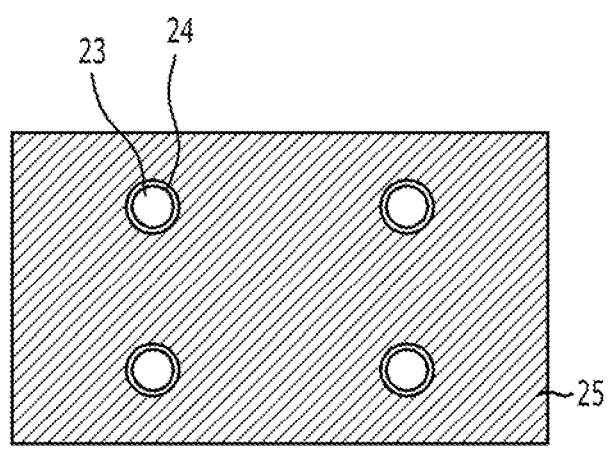

Referring to FIGS. 10A and 10B, a conductive layer 25 for gate electrode is formed over a resulting structure where the tunnel insulation layer, the charge trap layer, and the charge blocking layer 24 are formed, and a planarization process is performed on the conductive layer. The conductive layer 25 for gate electrode is buried in an opened region between the interlayer dielectric layers 21.

The conductive layer 25 for gate electrode may include metal silicide, metal, metal oxide, or metal nitride. For example, the conductive layer 25 may include TiN, WN, TiAlN, TaN, TaCN, or MoN. In particular, the conductive layer 25 may further include a low-resistance material, for example, W, Al, or Cu.

The formation of the conductive layer 25 for gate electrode may be performed by a CVD process or an atomic layer deposition (ALD) process.

Figure 11A:
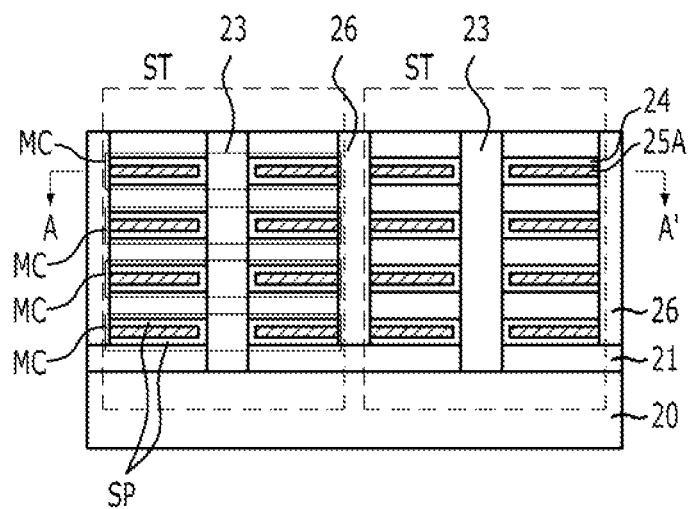
Figure 11B:
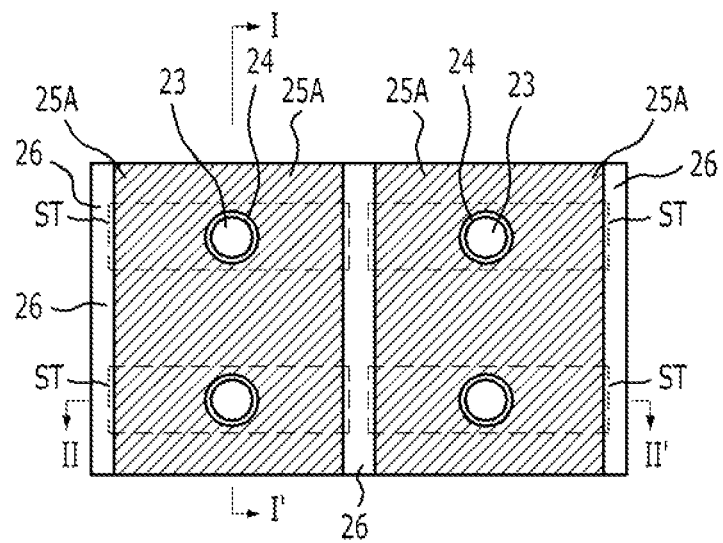

Referring to FIGS. 11A and 11B, a plurality of mask patterns (not shown) are formed on a resulting structure where the conductive layer 25 for gate electrode is formed. The mask patterns (not shown) cover a region where memory cells MC will be formed, and extend in parallel in a first direction I-I'. A plurality of gate electrodes 25A are formed by etching the conductive layer 25 using the mask patterns as an etch barrier.

At this point, the width of the mask patterns may be determined considering the thickness of the gate electrodes 25A. In etching the conductive layer 25 for gate electrode, the adjacent layers 21 and 24 may also be etched along the width of the mask patterns.

The etched region is filled with an insulation layer 26. In this way, a plurality of memory cells MC each including the channel 23, the tunnel insulation layer, the charge trap layer, and the charge blocking layer 24 are formed. Furthermore, a plurality of strings ST including the plurality of memory cells MC stacked along the channels 23 are formed.

A plurality of spacers SP each including the tunnel insulation layer, the charge trap layer, and the charge blocking layer 24 are formed on sidewalls of the gate electrodes 25A of the memory cells MC. The spacers SP may include an oxide-nitride-oxide (ONO) layer.

Although not shown, the interlayer dielectric layers 21 and the gate electrodes 25A are patterned to form a plurality of metal lines connected to the respective gate electrodes.

As mentioned above, after the channels 23 are formed, the tunnel insulation layer, the charge trap layer, and the charge blocking layer 24 can be sequentially formed. Therefore, the layer quality of the tunnel insulation layer can be improved. By forming the channels 23 of the single crystal silicon, the current flow in the channels 23 can be improved, and the uniformity of the threshold voltage distribution can also be improved.

FIGS. 12A to 13B are diagrams illustrating a method for fabricating a vertical channel type nonvolatile memory device in accordance with a second embodiment of the present invention. In particular, a case of forming rectangular pillar type channels is illustrated. Figures "A" are cross-sectional views illustrating intermediate results, and figures "B" are plan views at height A-A' of figures "A". Since a detailed fabrication process of the vertical channel type nonvolatile memory device in accordance with the second embodiment of the present invention is identical to that in accordance with the first embodiment of the present invention, its detailed description will be omitted.

Figure 12A:
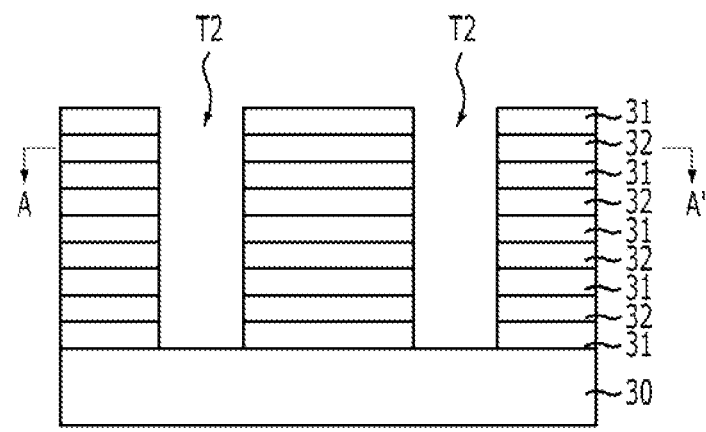
FIGS. 12A to 18B are diagrams illustrating a method for fabricating a vertical channel type nonvolatile memory device in accordance with a second embodiment of the present invention.
Figure 12B:
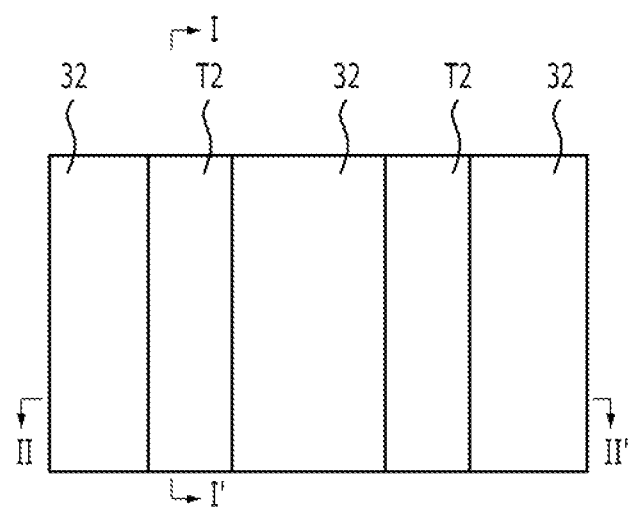

Referring to FIGS. 12A and 12B, a plurality of interlayer dielectric layers 31 and a plurality of sacrificial layers 32 are alternately formed on a substrate 30. The sacrificial layer 32 may be formed of amorphous carbon or nitride, for example, $Si_3N_4$.

The interlayer dielectric layers 31 and the sacrificial layers 32 are selectively etched to form a plurality of line type openings T2 exposing the substrate 30 and extending in parallel in a first direction I-I'.

Figure 13A:
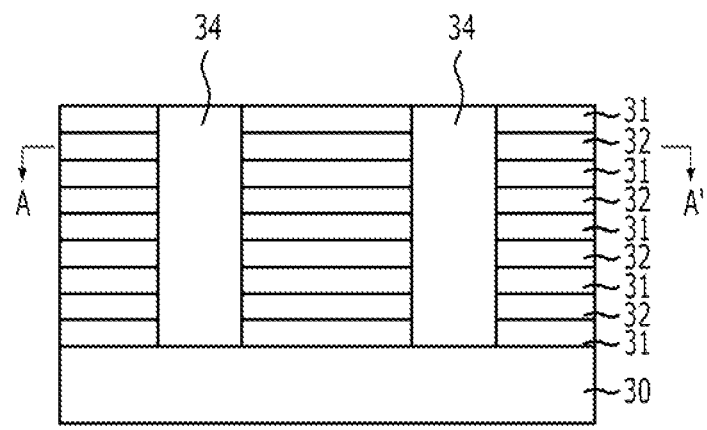
Figure 13B:
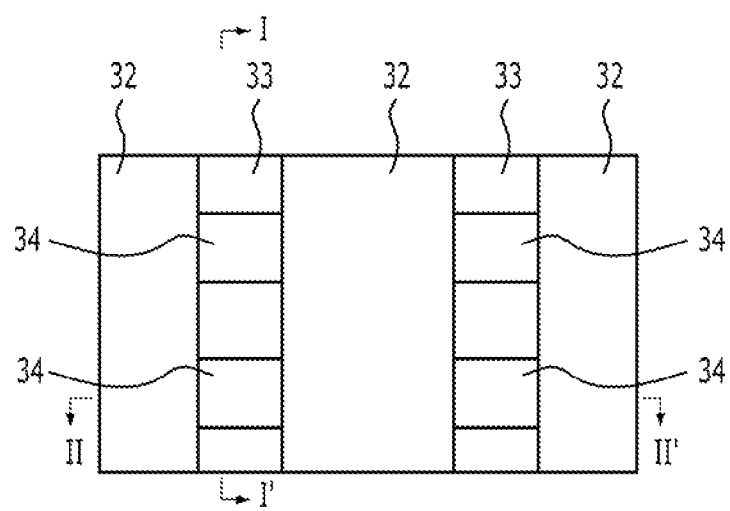

Referring to FIGS. 13A and 13B, the line type openings are filled with a layer for channel to form a plurality of rectangular pillar type channels 34 protruding from the substrate 30. A method for forming the channels 34 will be described hereinafter.

First, the line type openings T2 are filled with an insulation layer 33. The insulation layer 33 may be formed of oxide. A plurality of line type mask patterns (not shown) extending in parallel in a second direction are formed on a resulting structure where the insulation layer 33 is formed. The insulation layer 33 is etched using the mask patterns (not shown) as an etch barrier. In this way, the openings for rectangular pillar type channels are formed to expose the substrate 30. The openings for channels are filled with a layer for channel to form a plurality of channels 34 protruding vertically from the substrate 30. At this point, the channels 34 have a rectangular pillar shape, and the insulation layer 33 is buried in the region between the channels 34 arranged in the first direction I-I'.

Second, after the line type openings T2 are filled with the layer for channel, a plurality of mask patterns (not shown) extending in parallel in the second direction II-II' are formed on a resulting structure where the layer for channel is buried. Using the mask patterns (not shown) as an etch barrier, the buried layer for channel is etched to form rectangular pillar type channels 34. The etched region is filled with an insulation layer 33. In this way, the rectangular pillar type channels are formed, and the insulation layer 33 is buried in the region between the channels 34 arranged in the first direction I-I'.

Figure 14A:
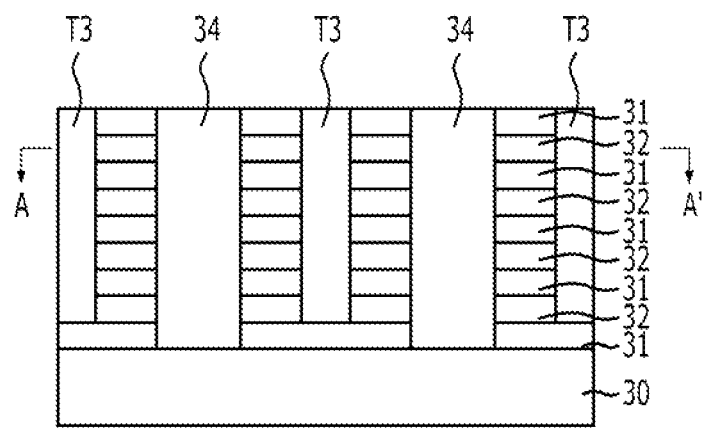
Figure 14B:
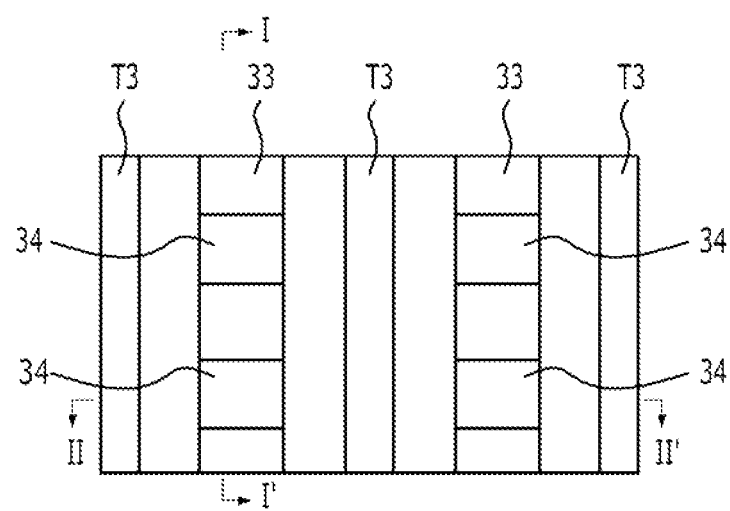

Referring to FIGS. 14A and 14B, the multi-layered sacrificial layers 32 and the multi-layered interlayer dielectric layers 31 are selectively etched to form openings T3 for removal of the sacrificial layers disposed between a plurality of the channels 34.

Figure 15A:
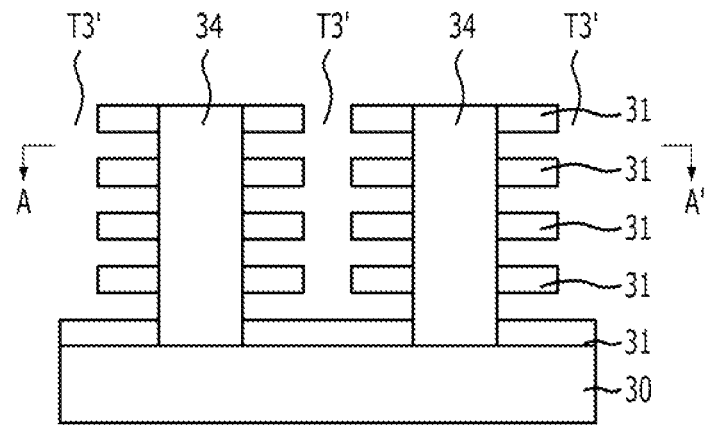
Figure 15B:
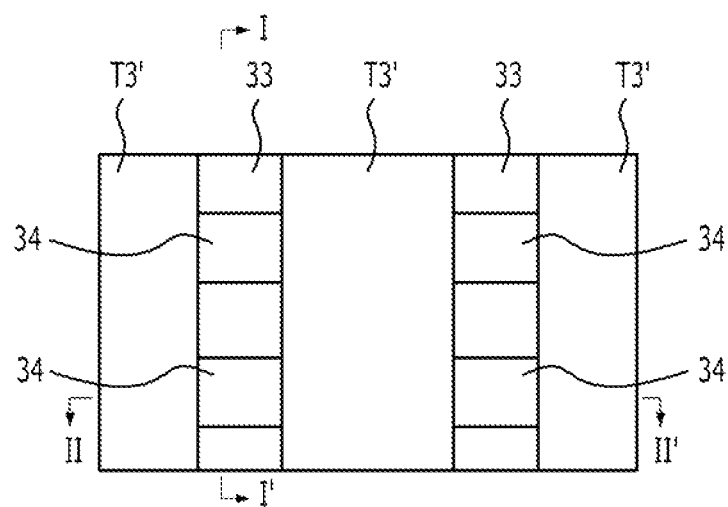

Referring to FIGS. 15A and 15B, the multi-layered sacrificial layers 32 exposed by the openings T3 for removal of the sacrificial layers are removed to expose sidewalls of the channels 34. At this point, due to the removal of the multi-layered sacrificial layers 32, the openings T3' for removal of the sacrificial layers extend up to the sidewalls of the channels 34. Therefore, the sidewalls of the channels 23 are exposed at certain intervals through the space where the sacrificial layers 32 are removed, and a tunnel insulation layer, a charge trap layer, a charge blocking layer, and a gate electrode are formed in a subsequent process in the space where the sacrificial layers 32 are removed.

Figure 16A:
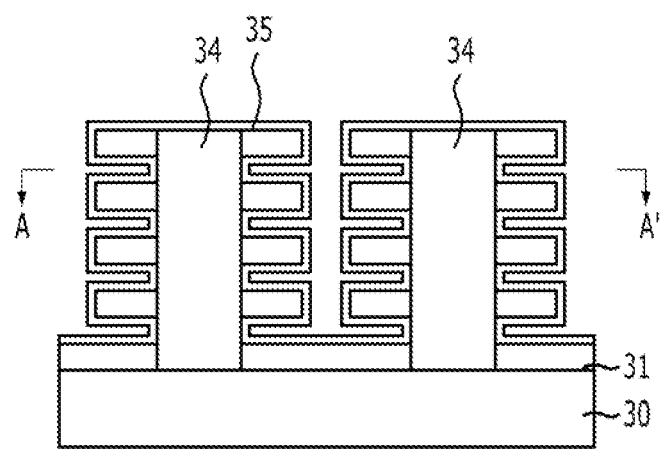
Figure 16B:
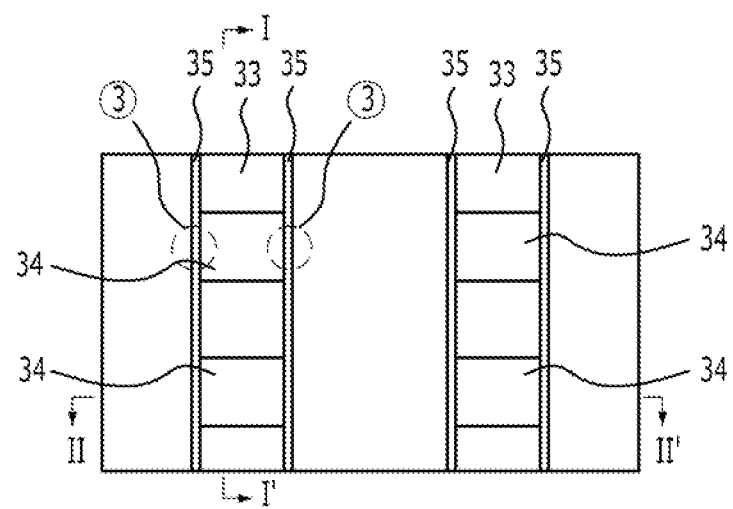

Referring to FIGS. 16A and 16B, the tunnel insulation layer, the charge layer, and the charge blocking layer 35 are sequentially formed over a resulting structure where the sidewalls of the channels 34 are exposed. In this way, the tunnel insulation layer, the charge trap layer, and the charge blocking layer 35 are sequentially formed on the exposed sidewalls of the channels 34. The tunnel insulation layer, the charge trap layer, and the charge blocking layer are illustrated as one layer and represented by a reference numeral "35".

In sequentially forming the tunnel insulation layer, the charge trap layer, and the charge blocking layer 35 over the resulting structure where the sacrificial layers 32 are removed, the tunnel insulation layer, the charge trap layer, and the charge blocking layer 35 may be formed to a certain thickness at which the space between the multi-layered interlayer dielectric layers 31 is not completely filled. That is, the tunnel insulation layer, the charge trap layer, and the charge blocking layer 35 may be formed to a certain thickness at which the space between the multi-layered interlayer dielectric layers is opened to some degree, that is, the space for gate electrode is ensured therebetween. In this way, spacers may be formed between the interlayer dielectric layer 31 and conductive layers 36 for gate electrode which will be formed in a subsequent process.

In addition, since the insulation layer 33 is buried in the region between the channels 34 arranged in the first direction, the tunnel insulation layer, the charge trap layer, and the charge blocking layer 35 are formed only on the sidewalls having the rectangular pillar shape (see a reference numeral ③). That is, the charge trap layer may be separately formed on either sidewall of the channel 34.

Figure 17A:
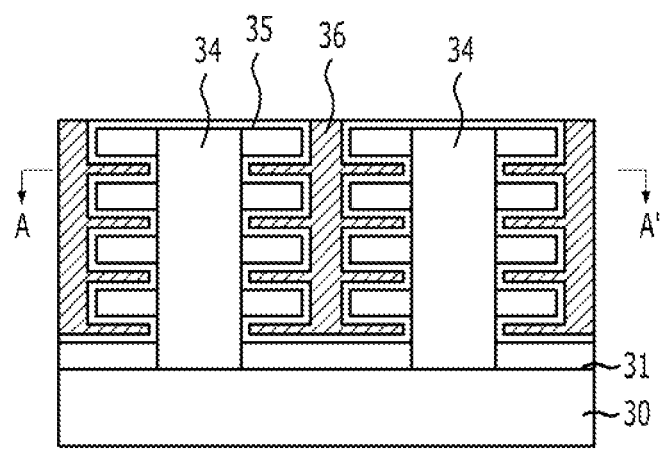
Figure 17B:
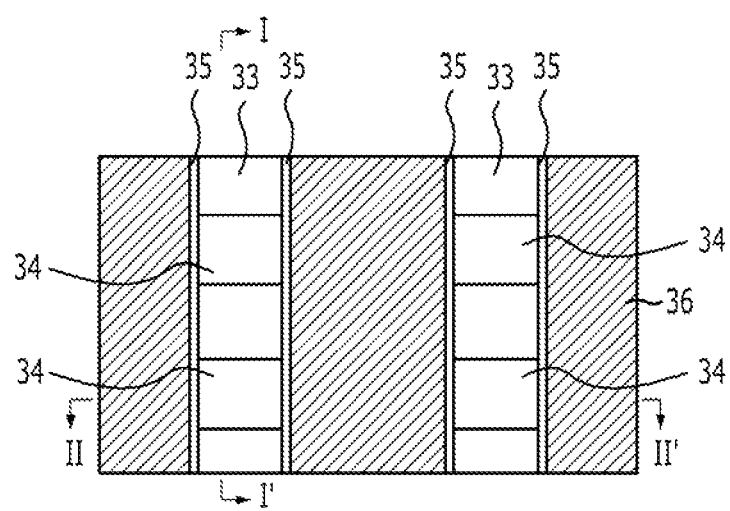

Referring to FIGS. 17A and 17B, a conductive layer 36 for gate electrode is formed over a resulting structure where the tunnel insulation layer, the charge trap layer, and the charge blocking layer 35 are formed, and a planarization process is performed on the conductive layer 36. The conductive layer 36 for gate electrode is buried in an opened region between the multi-layered interlayer dielectric layers 31.

Figure 18A:
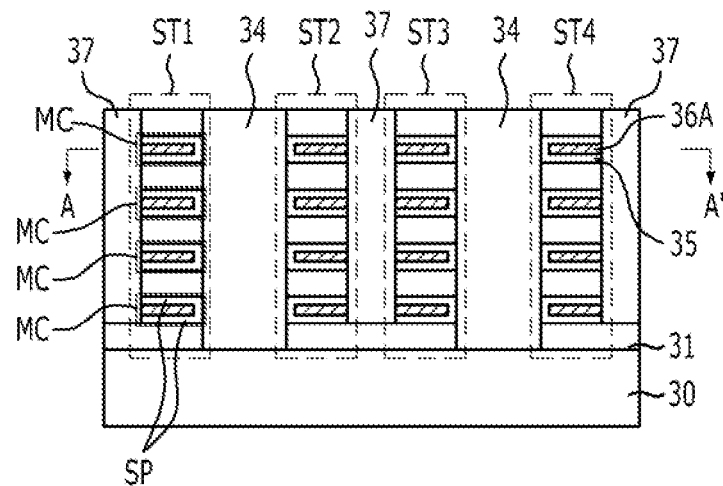
Figure 18B:
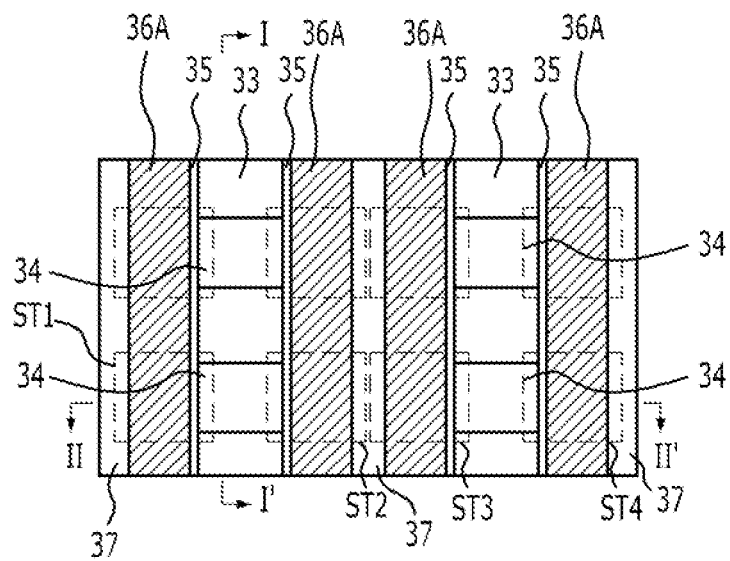

Referring to FIGS. 18A and 18B, a plurality of mask patterns (not shown) are formed on a resulting structure where the conductive layer 36 for gate electrode is formed. The mask patterns (not shown) cover the channels 34 and a region where memory cells MC will be formed, and extend in parallel in a first direction I-I'. A plurality of gate electrodes 36A are formed by etching the conductive layer 36 using the mask patterns as an etch barrier.

The etched region is filled with an insulation layer 37. In this way, a plurality of memory cells MC each including the channel 34, the tunnel insulation layer, the charge trap layer, the charge blocking layer 35, and the gate electrode 36A are formed. A plurality of spacers SP, each including the tunnel insulation layer, the charge trap layer, and the charge blocking layer 35, are formed on sidewalls of the gate electrodes 36A of the memory cells MC. The spacers SP may include an oxide-nitride-oxide (ONO) layer.

In this way, a plurality of strings ST, each including the plurality of memory cells MC stacked along the channels 34, are formed. In particular, due to the insulation layer 33 buried in the region between the channels 34 arranged in the first direction, two strings ST sharing one channel 34 are separated from each other. Therefore, the strings ST are formed on both sides of the rectangular pillar type channel 34, and two strings ST can be formed with respect to one channel 34. That is, two strings ST1 and ST2 (ST3 and ST4) share one channel 34.

Although not shown, the multi-layered interlayer dielectric layers 31 and the gate electrodes 36A are patterned to form a plurality of metal lines connected to the respective gate electrodes.

As mentioned above, since at least two strings ST are formed to share one channel 34, the integration density of the vertical channel type nonvolatile memory device can be increased.

FIGS. 19A to 26B are diagram illustrating a method for fabricating a vertical channel type nonvolatile memory device in accordance with a third embodiment of the present invention. Figures "A" are cross-sectional views illustrating intermediate results, and figures "B" are plan views at height A-A' of figures "A". Since a detailed fabrication process of the vertical channel type nonvolatile memory device in accordance with the third embodiment of the present invention is identical to that in accordance with the first embodiment of the present invention, its detailed description will be omitted.

Figure 19A:
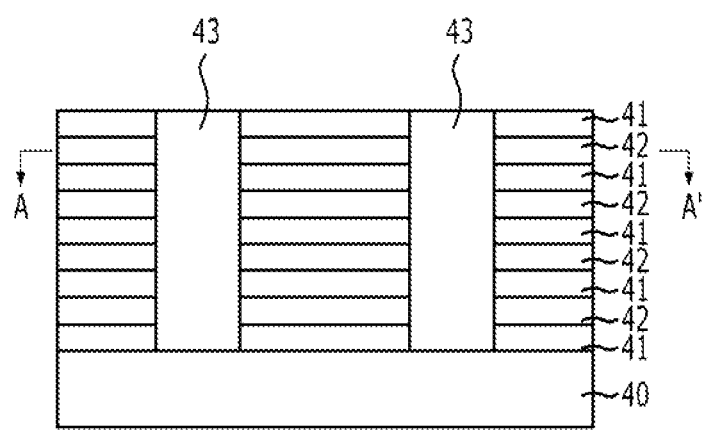
FIGS. 19A to 26B are diagrams illustrating a method for fabricating a vertical channel type nonvolatile memory device in accordance with a third embodiment of the present invention.
Figure 19B:
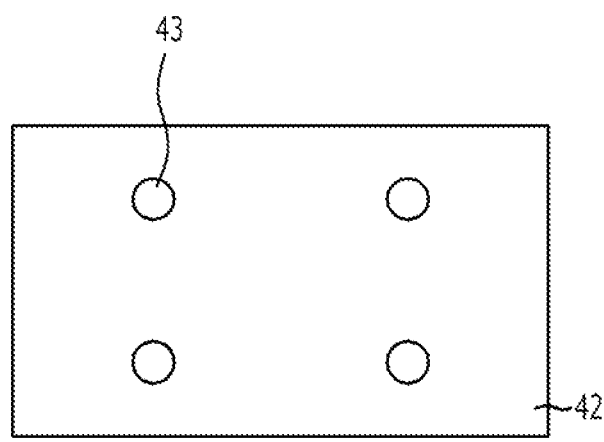

Referring to FIGS. 19A and 19B, multi-layered interlayer dielectric layers 41 and multi-layered sacrificial layers 42 are alternately formed on a substrate 40 where a lower structure (not shown) including a source line a lower selection transistor and the like is formed. The sacrificial layers 42 may be formed of a material having a high etch selectivity to the interlayer dielectric layers 41. For example, the sacrificial layers 42 may be formed of amorphous carbon or nitride, specifically, $Si_3N_4$.

The interlayer dielectric layers 41 and the sacrificial layers 42 are selectively etched to form a plurality of openings for channel which expose the substrate 40.

The interval between the openings for channel may be determined, considering the thickness of a tunnel insulation layer, a charge trap layer, a charge blocking layer, and a gate electrode which will be formed in a subsequent process. In particular, the openings for channel may be formed in a hole type, and the width of the openings for channel may be approximately 1 μm or less. As such, when the hole type openings for channel are formed, the interval between the channels is reduced and thus the integration density of the memory device can be further increased.

The openings for channel are filled with the layer for channel to form a plurality of channels 43 protruding from the substrate 40. As mentioned above, when the hole type openings for channel are filled with the layer for channel, the pillar type channels 43 are formed and thus subsequent processes are performed more easily.

The channels 43 may be formed by growing single crystal silicon or depositing polycrystal silicon.

Figure 20A:
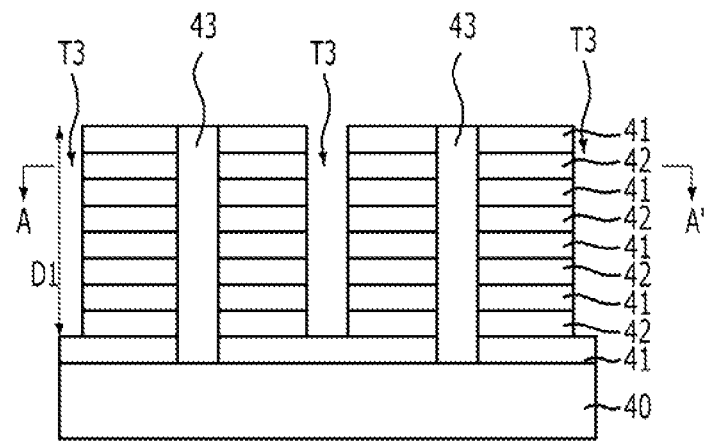
Figure 20B:
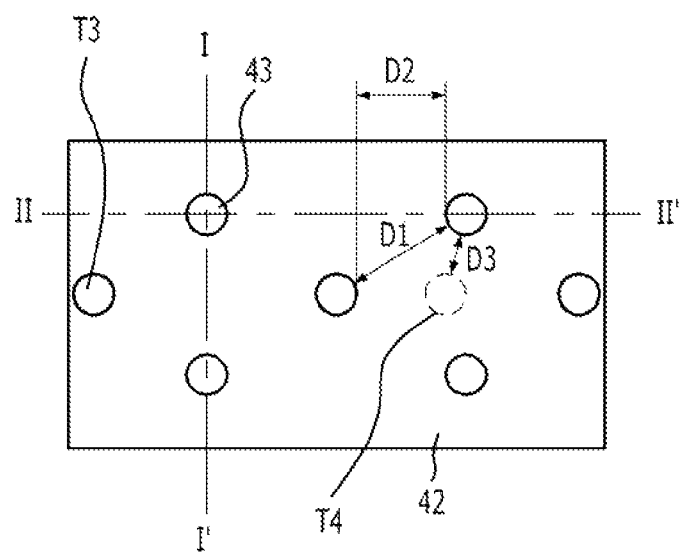

Referring to FIGS. 20A and 20B, the multi-layered sacrificial layers 42 and the multi-layered interlayer dielectric layers 41 are selectively etched to form a plurality of hole type openings T3 for removal of the sacrificial layers disposed between the channels 43.

The openings T3 are formed for removing the multi-layered sacrificial layers 42. The openings T3 may be formed in various shapes such as a line type, in addition to the hole type. However, when the openings T3 are formed in the hole type, the integration density of the memory device can be further increased, which will be described hereinafter in more detail.

When the hole type openings T3 for removal of the sacrificial layer are formed between the channels 43 arranged in the first direction I-I' and the second direction II-II' intersecting with the first direction I-I', the hole type openings T3 and the channels 43 are arranged to cross each other. In this way, a distance D2 between the openings T3 and the channels 43 can be further reduced.

When the line type openings extending in the first direction I-I' are formed, the distance D2 between the openings and the channels 43 must be considered. On the other hand, when the hole type openings T3 and the channels 43 are arranged to cross each other, a distance D1 between the openings T3 and the channels 43 in a diagonal direction must be considered.

That is, as illustrated in FIG. 20B, a distance D3 between the openings T4 for removal of the sacrificial layers and the channels 43 can be further reduced. Hence, the integration density of the channels 43 and the openings for removal of the sacrificial layers can be further increased.

The distance D1 between the openings T3 for removal of the sacrificial layer and the channels 43 may be determined, considering the thickness of the tunnel insulation layer, the charge trap layer, and the charge blocking layer 44 which are formed on the sidewalls of the channels 43 in the subsequent process.

For illustrative purposes, the sectional view showing the cross section of the channels 43 and the openings T3 for removal of the sacrificial layers is illustrated in FIG. 20A. However, as mentioned above, when the distance D3 between the channels 43 and the openings T4 for removal of the sacrificial layer is reduced, the channels 43 and the openings T4 for removal of the sacrificial layers may be arranged to overlap each other in view of the cross section.

The hole type openings T3 for removal of the sacrificial layers may be formed to have a width of 1 µm or less.

Figure 21A:
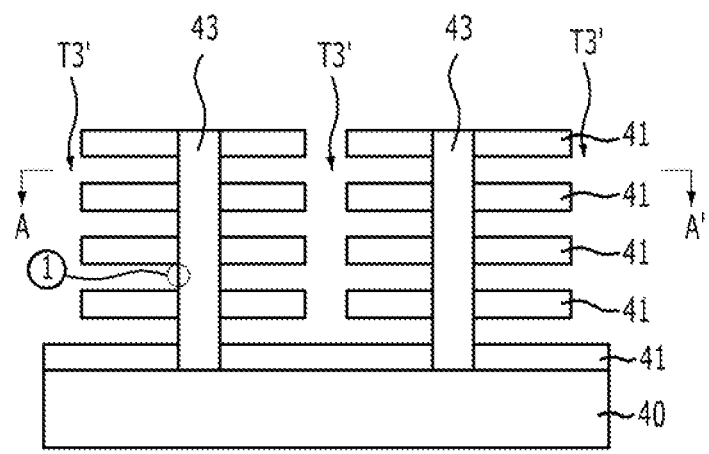
Figure 21B:
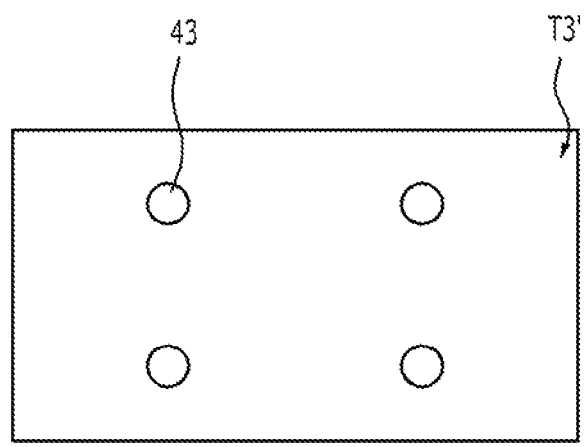

Referring to FIGS. 21A and 21B, the multi-layered sacrificial layers 42 exposed by the openings T3 for removal of the sacrificial layer are removed to expose the sidewalls of the channels 43. At this point, due to the removal of the sacrificial layers 42, the openings T3' for removal of the sacrificial layers extend up to the sidewalls of the channels 43. Therefore, the sidewalls of the channels 43 are exposed at certain intervals through the space where the sacrificial layers 42 are removed (see ① of FIG. 21A), and a tunnel insulation layer, a charge trap layer, a charge blocking layer, and a gate electrode are formed in the space, where the sacrificial layers 42 are removed, in a subsequent process.

Figure 22A:
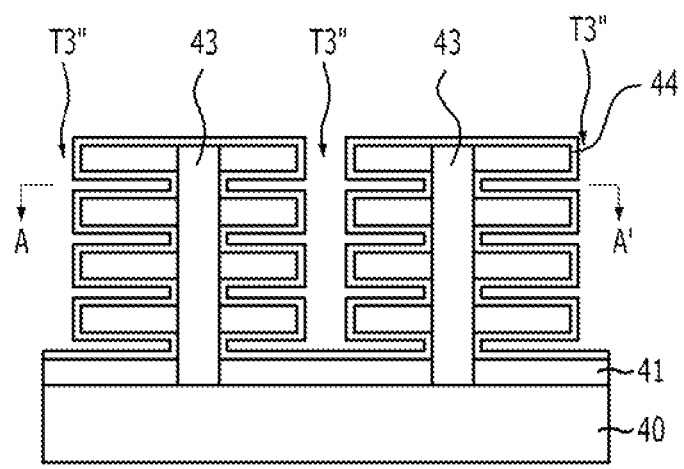
Figure 22B:
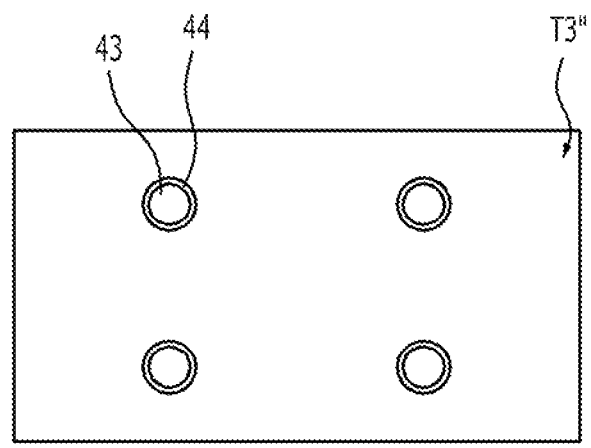

Referring to FIGS. 22A and 22B, the tunnel insulation layer, the charge trap layer, and the charge blocking layer 44 are sequentially formed over a resulting layer where the channels 43 are exposed. In this way, the tunnel insulation layer, the charge trap layer, and the charge blocking layer 44 are sequentially formed on the sidewalls of the exposed channels 43, and the width of the openings T3" for removal of the sacrificial layers between the multi-layered interlayer dielectric layers 41 is reduced. The tunnel insulation layer, the charge trap layer, and the charge blocking layer are illustrated as one layer and represented by a reference numeral "44"

In sequentially forming the tunnel insulation layer, the charge trap layer, and the charge blocking layer 44 over the resulting structure where the sacrificial layers 42 are removed, the tunnel insulation layer, the charge trap layer, and the charge blocking layer 44 may be formed to a certain thickness at which the space between the multi-layered interlayer dielectric layers 41 is not completely filled. That is, the tunnel insulation layer, the charge trap layer, and the charge blocking layer 44 may be formed to a certain thickness at which the space between the interlayer dielectric layers is opened to some degree, that is, the space for gate electrode is ensured.

The tunnel dielectric layer may be formed to a thickness ranging from approximately 1 Å to approximately 200 Å, and the charge trap layer may be formed to a thickness ranging from approximately 1 Å to approximately 500 Å. The charge blocking layer may be formed to a thickness ranging from approximately 1 Å to approximately 500 Å. Moreover, the charge trap layer may be formed of nitride or polycrystal silicon, and the charge blocking layer may be formed of a material having a high dielectric constant.

A process of forming gate electrodes of the memory cells stacked along the channels is performed. The gate electrode is formed by filling the opened region between the interlayer dielectric layers, that is, the opened region between the charge blocking layers, with a conductive layer for gate electrode. A gate electrode separation layer is formed by filling the openings for removal of the sacrificial layer, where the gate electrodes are formed, with an insulation layer.

As the method for forming the gate electrode in accordance with the first embodiment, a case of forming the conductive layer for gate electrode so that the center region is opened will be described hereinafter with reference to FIGS. 23A to 24B. As the method for forming the gate electrode in accordance with the second embodiment, a case of forming the conductive layer for gate electrode so that the openings T3" for removal of the sacrificial layers are completely filled will be described hereinafter with reference to FIGS. 25A to 26B.

A method for forming a gate electrode in accordance with a first embodiment of the present invention will be described hereinafter.

Figure 23A:
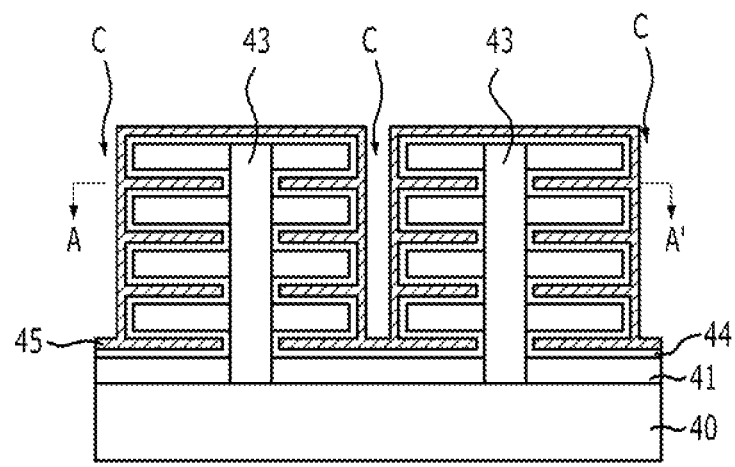
Figure 23B:
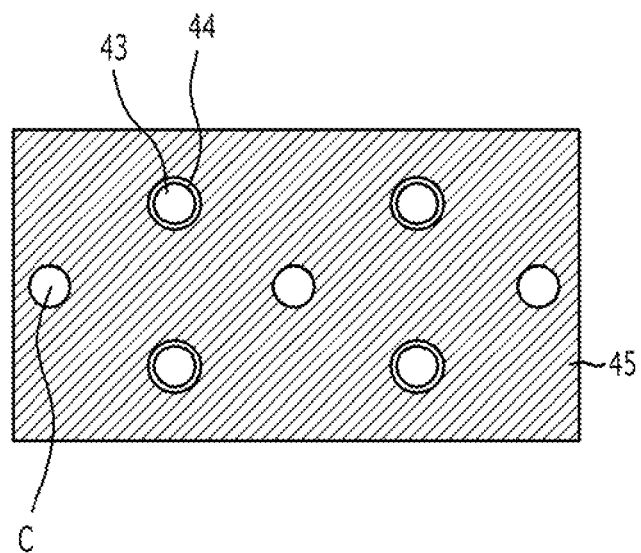

Referring to FIGS. 23A and 23B, conductive layers 45 for gate electrode are formed so that the opened regions between the interlayer dielectric layers, that is, the opened regions between the charge blocking layers, are filled and the center regions C of the openings T3" for removal of the sacrificial region are opened. Therefore, the center regions C have a hole type trench shape, and the conductive layers 45 for gate electrode are formed along the inner walls of the center regions C.

The conductive layers 45 for gate electrode may be formed of polysilicon, metal, a combination thereof, or a metal compound. The metal compound may include CoSix or NiSi.

Figure 24A:
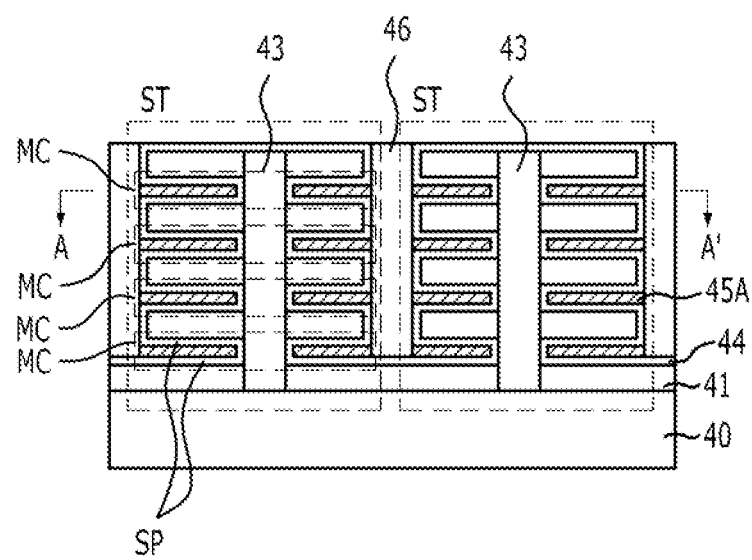
Figure 24B:
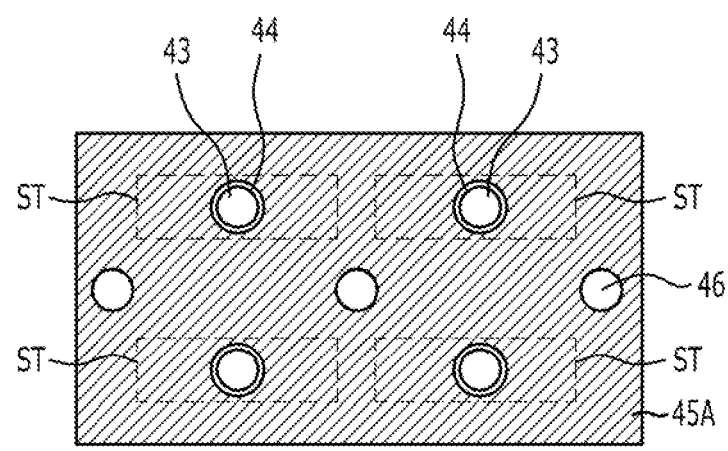

Referring to FIGS. 24A and 24B, the conductive layers 45 for gate electrode, which are formed along the inner walls, may be removed by a dry etch process or a wet etch process.

The center regions C where the conductive layers 45 formed along the inner walls are filled with an insulation layer. The insulation layer 46 is a gate separation layer for separating the multi-layered gate electrodes, and may include an oxide layer.

A method for forming a gate electrode in accordance with a second embodiment of the present invention will be described hereinafter.

Figure 25A:
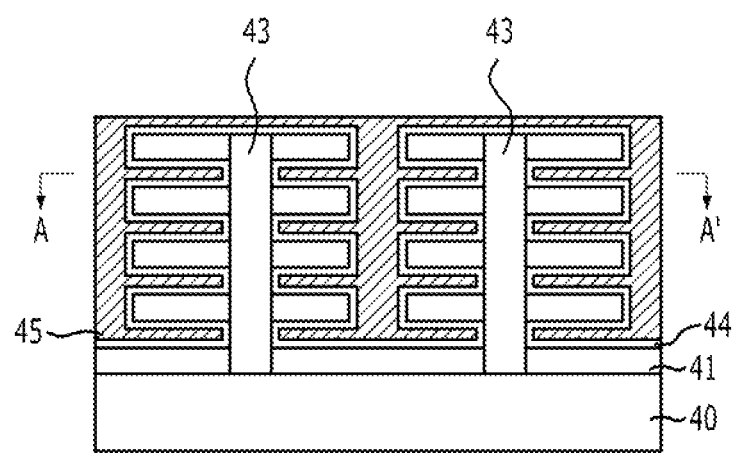
Figure 25B:
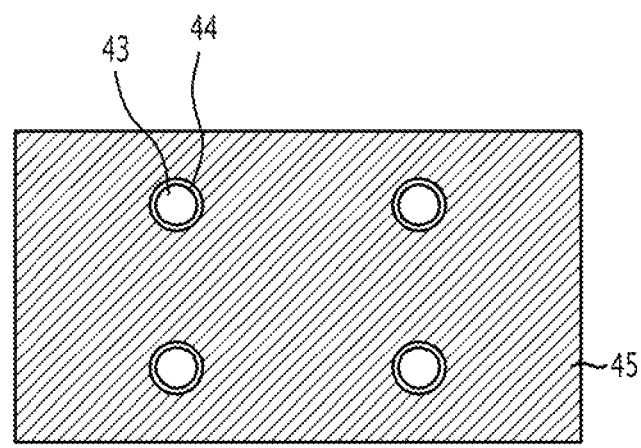

Referring to FIGS. 25A and 25B, conductive layers 45 for gate electrode are formed over a resulting structure where the tunnel insulation layer, the charge trap layer, the charge blocking layer 44 are formed, so that the opened region between the multi-layered interlayer dielectric layers are filled. At this point, the openings T3" for removal of the sacrificial layer are completely filled with the conductive layers 45 for gate electrode.

Figure 26A:
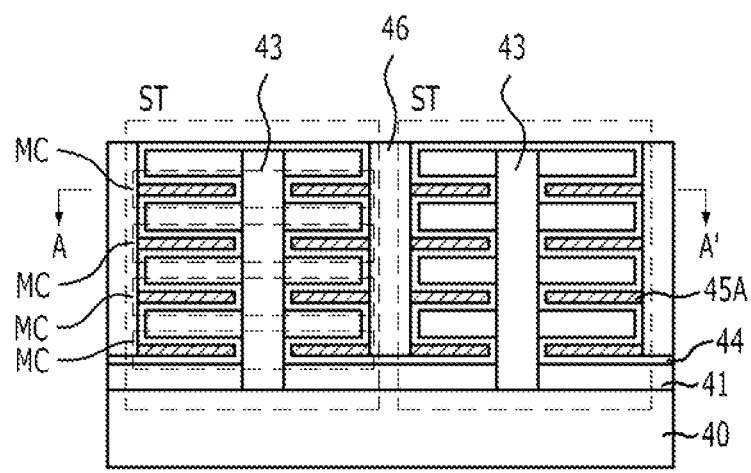
Figure 26B:
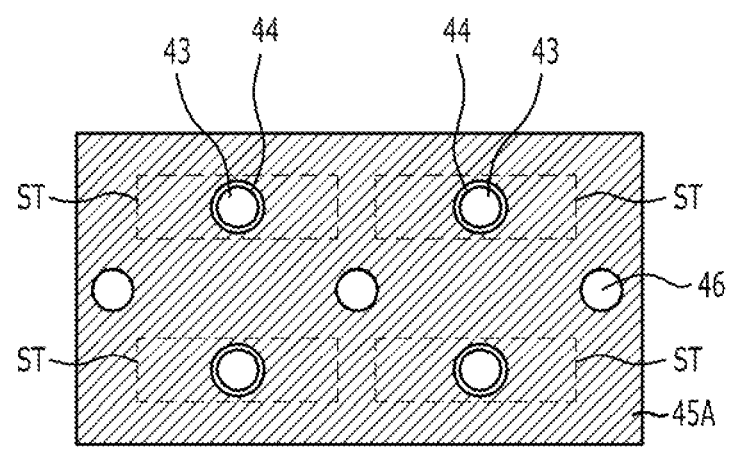

Referring to FIGS. 26A and 26B, the conductive layers 45 for gate electrode are selectively etched to separate gate electrodes 45A of the memory cells from one another, the memory cells being stacked along the channels 43.

The conductive layers 45 for gate electrode may be etched by a blanket etch process. When the blanket etch process is performed, the tunnel insulation layer, the charge trap layer, and the charge blocking layer 44 formed at the uppermost portion of the memory cell MC serve as an etch barrier, and only the conductive layers 45 buried between the memory cells MC are selectively etched. Therefore, the gate electrodes of the memory cells MC can be separated from one another, without forming separate mask patterns.

The regions, where the conductive layers 45 for gate electrode are etched, are filled with an insulation layer 46. The insulation layer 46 serves as a gate electrode separation layer for separating the multi-layered gate electrodes and may include an oxide layer.

In this way, the semiconductor memory device is fabricated which includes the gate electrode 45A alternately stacked with the interlayer insulation layer 41 on the substrate 40, the channel 43 buried within a plurality of gate electrode 45A and the interlayer dielectric layer 41 and protruding vertically from the substrate 40, and the memory cell including the tunnel insulation layer, the charge trap layer, and the charge blocking layer 44 between the gate electrode 45A and the channel 43. Furthermore, the string (ST) structure arranged vertically from the substrate 40 is formed by the memory cells MC stacked along the channel 43.

In the memory cells MC stacked along the channel 43, the gate electrodes 45A are separated by the insulation layer 46 buried within the gate electrodes 45A and the interlayer dielectric layers 41, that is, the gate electrode separation layer. Moreover, since the memory cells MC formed on the same layer share the gate electrode 45A, they operate as one page in a read operation.

As mentioned above, the integration density of the memory device can be increased by forming the hole type openings for removal of the sacrificial layer. Furthermore, since the memory cells formed on the same layer operate as one page, the area necessary for the formation of the word lines is reduced and thus the integration density of the memory device is further increased.

Figure 27A:
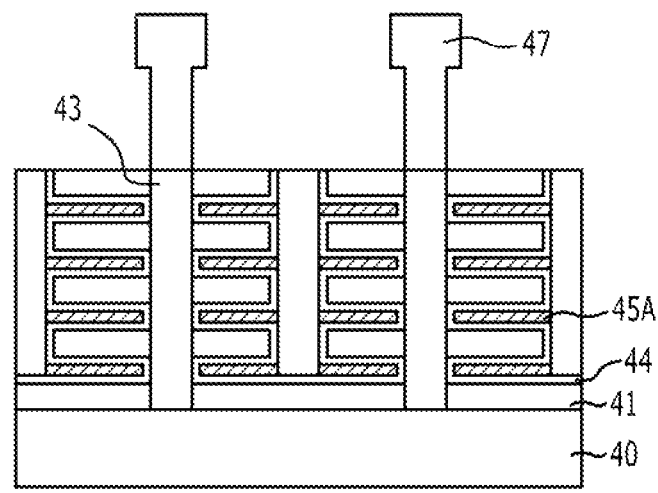
FIGS. 27A to 27C are diagrams illustrating a process of forming a bit line and a word line in accordance with an embodiment of the present invention.
Figure 27B:
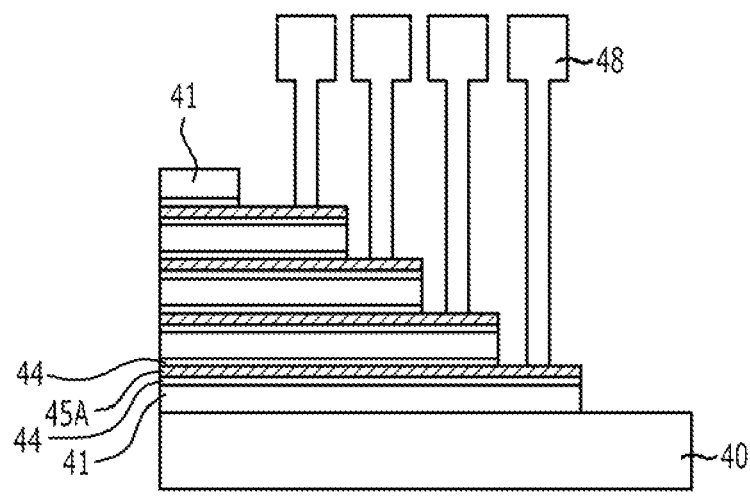
Figure 27C:
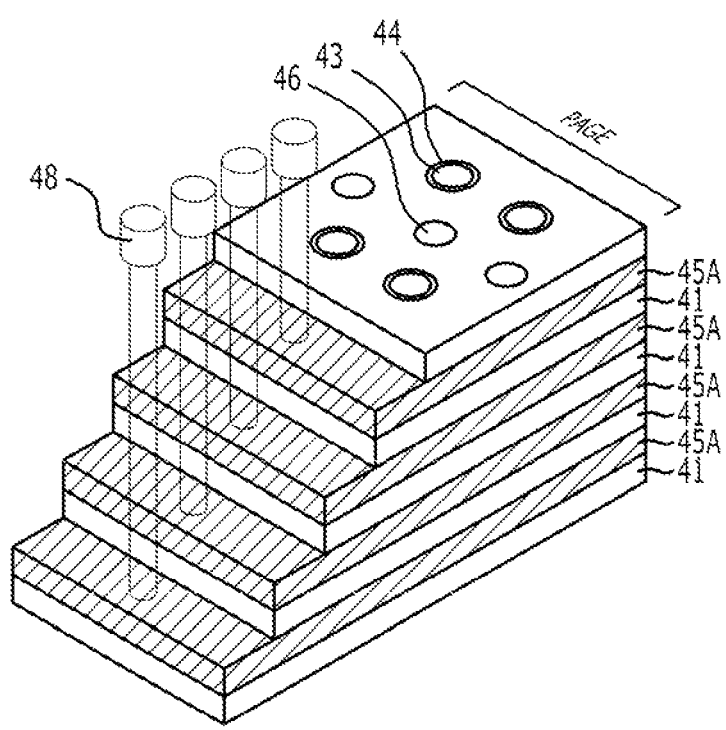

FIGS. 27A to 27C are diagrams illustrating a process of forming a plurality of hit lines and a plurality of word lines in accordance with an embodiment of the present invention.

FIG. 27A is a cross-sectional view of an intermediate resulting structure, where a plurality of bit lines are formed. Referring to FIG. 27A, after exposing the surfaces of the channels 43, a plurality of bit lines connected to the channels 43 are formed. That is, the bit lines may be formed after forming a plurality of contact plugs connected to the channels 43.

FIG. 27B is a cross-sectional view of an intermediate resulting structure where a plurality of word lines are formed, and FIG. 27C is a perspective view of the intermediate resulting structure where the word lines are formed. Referring to FIG. 27B, the previously formed layers such as the interlayer dielectric layer 41, the tunnel insulation layer, the charge trap layer, and the charge blocking layer 44, and the gate electrode 45A are patterned to expose the gate electrodes of the memory cells stacked along the channels 43.

A plurality of word lines 48 connected to the gate electrodes of the memory cells are formed. The word lines may be formed after forming a plurality of contact plugs connected to the gate electrodes.

At this point, since the memory cells formed on the same layer are formed to operate as one page, one word line 48 is formed one layer. Thus, compared with the prior art, the number of the word lines 48 is reduced and therefore the area necessary for formation of the word lines may be effectively reduced. That is, the integration density of the memory device can be further increased.

In accordance with the embodiments of the present invention, the tunnel insulation layer, the charge trap layer, and the charge blocking layer can be sequentially formed after forming the channels. Thus, the layer quality of the tunnel insulation layer can be improved, and the current flow in the channels can be improved by forming the channels of single crystal silicon. In addition, the uniformity of the threshold voltage distribution can be improved.

Furthermore, the integration density of the vertical channel type nonvolatile memory device can be improved because at least two strings share one channel.

Moreover, the area necessary for formation of the word lines can be reduced because the plurality of memory cells formed on the same layer operate as one page. Thus, the integration density of the memory device can be further increased.

While the present invention has been described with respect to the specific embodiments, it will be apparent to those skilled in the art that various changes and modifications may be made without departing from the spirit and scope of the invention as defined in the following claims.

What is claimed is:

1. A vertical channel type nonvolatile memory device, comprising:
    a plurality of channels extending along a vertical direction from a semiconductor substrate and arranged along a first horizontal direction and a second horizontal direction crossing the first horizontal direction, wherein each of the channels includes first and second sides which are opposite to each other and parallel to the first horizontal direction;
    a first gate structure facing the first side of each of the channels while not facing other sides of each of the channels, and extending in the first horizontal direction to have a line shape, wherein the first gate structure includes first gate electrodes of first memory cells stacked along the vertical direction;
    a second gate structure facing the second side of each of the channels while not facing other sides of each of the channels, and extending in the first horizontal direction to have a line shape, wherein the second gate structure includes second gate electrodes of second memory cells stacked along the vertical direction; and
    an insulation layer positioned between two channels which is adjacent to each other in the first horizontal direction,
    wherein each of the channels has a rectangular pillar type including the first side, the second side, a third side between the first side and the second side, and a fourth side between the first side and the second side and opposite to the third side, and the insulation layer is in contact with the third and fourth sides of each of the channels.

2. The vertical channel type nonvolatile memory device of claim 1, further comprising:
   a spacer on a top surface and bottom surface of each of the first and second gate electrodes.

3. The vertical channel type nonvolatile memory device of claim 2, wherein the spacer comprises an oxide-nitride-oxide (ONO) layer.

4. The vertical channel type nonvolatile memory device of claim 1, further comprising:
   bit lines coupled to the channels and disposed over the channels.

* * * * *